(12) United States Patent
Köhler et al.

(10) Patent No.: US 8,158,485 B2
(45) Date of Patent: Apr. 17, 2012

(54) INTEGRATED CIRCUIT DEVICE HAVING OPENINGS IN A LAYERED STRUCTURE

(75) Inventors: Daniel Köhler, Chemnitz (DE); Manfred Engelhardt, Dresden (DE); Peter Baars, Dresden (DE); Hans-Peter Sperlich, Dresden (DE)

(73) Assignee: Qimonda AG, Munich (DE)

( * ) Notice: Subject to any disclaimer, the term of this patent is extended or adjusted under 35 U.S.C. 154(b) by 640 days.

(21) Appl. No.: 11/744,962

(22) Filed: May 7, 2007

(65) Prior Publication Data

US 2008/0277760 A1 Nov. 13, 2008

(51) Int. Cl.
*H01L 21/20* (2006.01)
(52) U.S. Cl. ............... 438/386; 257/506; 257/E27.092
(58) Field of Classification Search ........... 257/E27.092, 257/506; 438/386
See application file for complete search history.

(56) References Cited

U.S. PATENT DOCUMENTS

| 6,528,368 | B1 * | 3/2003 | Park ............... 438/253 |
| 6,720,249 | B1 | 4/2004 | Dalton et al. |
| 2001/0050436 | A1 | 12/2001 | Sakao |
| 2002/0081854 | A1 * | 6/2002 | Morrow et al. ........ 438/694 |
| 2003/0129805 | A1 * | 7/2003 | Kim ................. 438/386 |
| 2004/0161919 | A1 * | 8/2004 | Cha et al. ............ 438/618 |
| 2005/0074943 | A1 * | 4/2005 | Lai et al. ............. 438/386 |
| 2007/0259516 | A1 * | 11/2007 | Jahnes et al. ......... 438/618 |

FOREIGN PATENT DOCUMENTS

| DE | 19927284 C2 | 2/2001 |
| EP | 1120822 A1 | 8/2001 |
| JP | 10261707 | 9/1998 |

* cited by examiner

*Primary Examiner* — Thao Le
*Assistant Examiner* — Matthew Gordon
(74) *Attorney, Agent, or Firm* — Dicke, Billig & Czaja, PLLC

(57) ABSTRACT

An integrated circuit device includes a substrate with a first layer situated on the substrate. The first layer defines a first opening with a cover layer deposited on the first layer and coating a sidewall portion of the first opening. A second layer is situated on the cover layer. The second layer defines a second opening extending through the second layer and through the cover layer to connect the first and second openings.

45 Claims, 11 Drawing Sheets

INTEGRATED CIRCUIT DEVICE HAVING OPENINGS IN A LAYERED STRUCTURE

BACKGROUND

The present invention relates to structures with high aspect ratio in integrated circuit devices and a method of manufacturing the same.

Such high aspect ratio structures may be derived from an opening in a layer. In order to increase the depth of this opening while essentially maintaining the width, one approach is to arrange two openings on top of each other. When forming the top openings, the lower openings typically need to contain a sacrificial filling, which has to be removed through the top openings, thus adding cost and complexity.

For these and other reasons, there is a need for the present invention.

SUMMARY

In accordance with aspects of the present invention, an integrated circuit and associated method are disclosed. The exemplary integrated circuit device includes a substrate with a first layer situated on the substrate. The first layer defines a first opening with a cover layer deposited on the first layer and coating a sidewall portion of the first opening. A second layer is situated on the cover layer. The second layer defines a second opening extending through the second layer and through the cover layer to connect the first and second openings.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustrating specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
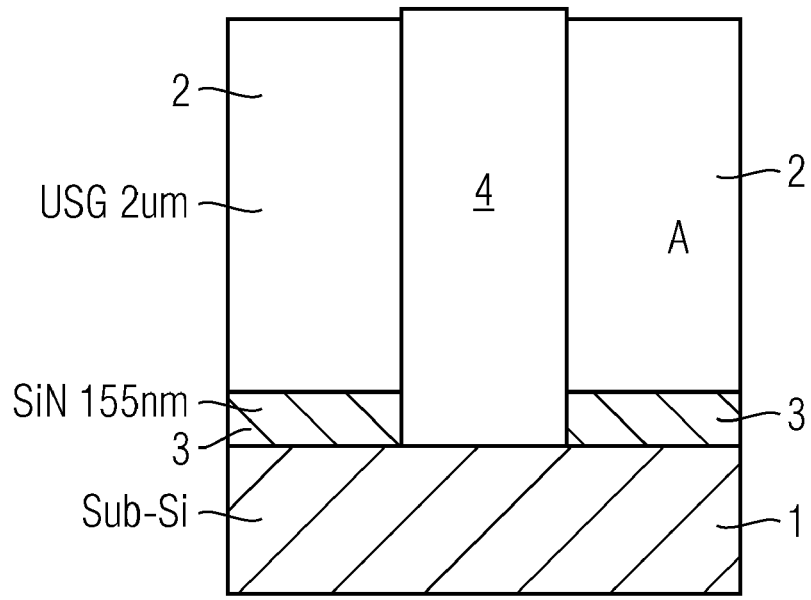
FIGS. 1-4 illustrate various portions of an integrated circuit device in accordance with an embodiment of the present invention.

FIG. 1 illustrates portions of an exemplary integrated circuit device in accordance with aspects of the present invention. The device includes a substrate 1 with a first layer 2. Depending on the particular embodiment, there may be a third layer 3 arranged between the first layer 2 and the substrate 1. In the first layer 2 and in a third layer 3 a first opening 4 is formed. The first opening 4 may represent a hole, a trench, an aperture or a recess, for example. The first opening 4 may be formed by an etching process. In one embodiment the first opening is formed by a dry etching process. In the illustrated embodiment, the substrate 1 may consist of silicon; for example, a silicon wafer. In other embodiments, the substrate 1 may have already undergone several steps of processing, such that certain structures and layers may already be present on and in the substrate 1. The third layer 3 may, for example, consist of silicon nitride. The first layer 2 may consist of undoped silicon glass. Depending on the embodiment, other material may also be used for the substrate 1, the first layer 2 and the third layer 3. Depending on the material of the first layer 2 and the third layer 3, different removal processes may be used for forming the first opening 4. Furthermore, the first opening 4 may also extend down to only an upper face of the third layer 3. The third layer may be made of SiN with a thickness of 155 nm. The first layer 2 may be made of undoped silicate glass (USG) with a thickness of 2 µm.

Figure 2:
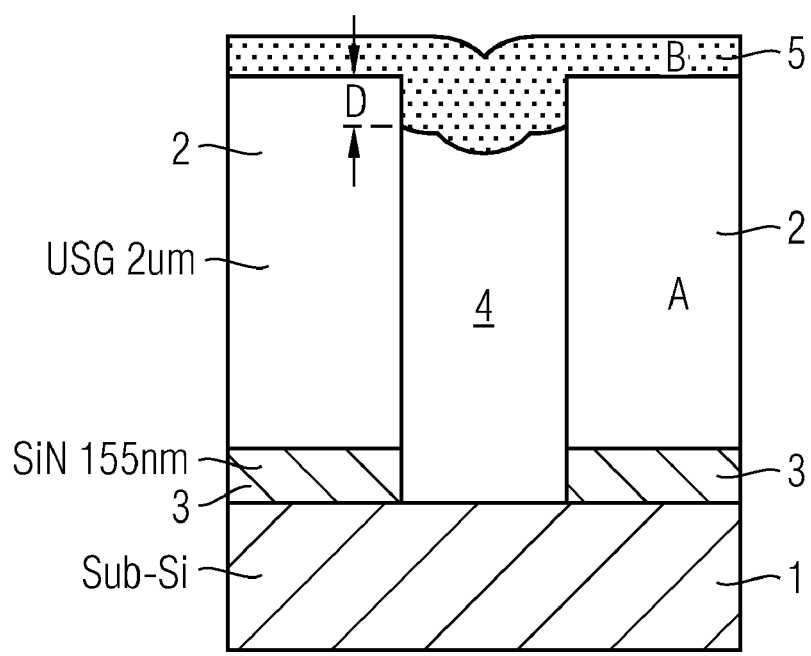

In the illustrated embodiment, an upper face of the first layer 2 is at least partially located in the region of the opening face of the first opening 4 covered with a cover layer 5. The cover layer 5 covers the first opening 4. The cover layer 5 may be deposited in a non-conformal depositing process. The cover layer 5 may for example comprise silicon nitride. Depending on the embodiment, other materials may also be used for covering, such as closing the opening face of the first opening 4 with a layer. This is illustrated in FIG. 2. Depending on the particular embodiment, the cover layer 5 may cover an upper section of the first opening 4 extending a depth D in the first opening 4. The cover layer 5 may fill the depth D of the first opening 4. Depending on the depositing process of the cover layer 5 only the sidewall of the upper section of the first opening 4 is covered in a shape of a sleeve by the cover layer 5.

Figure 3:
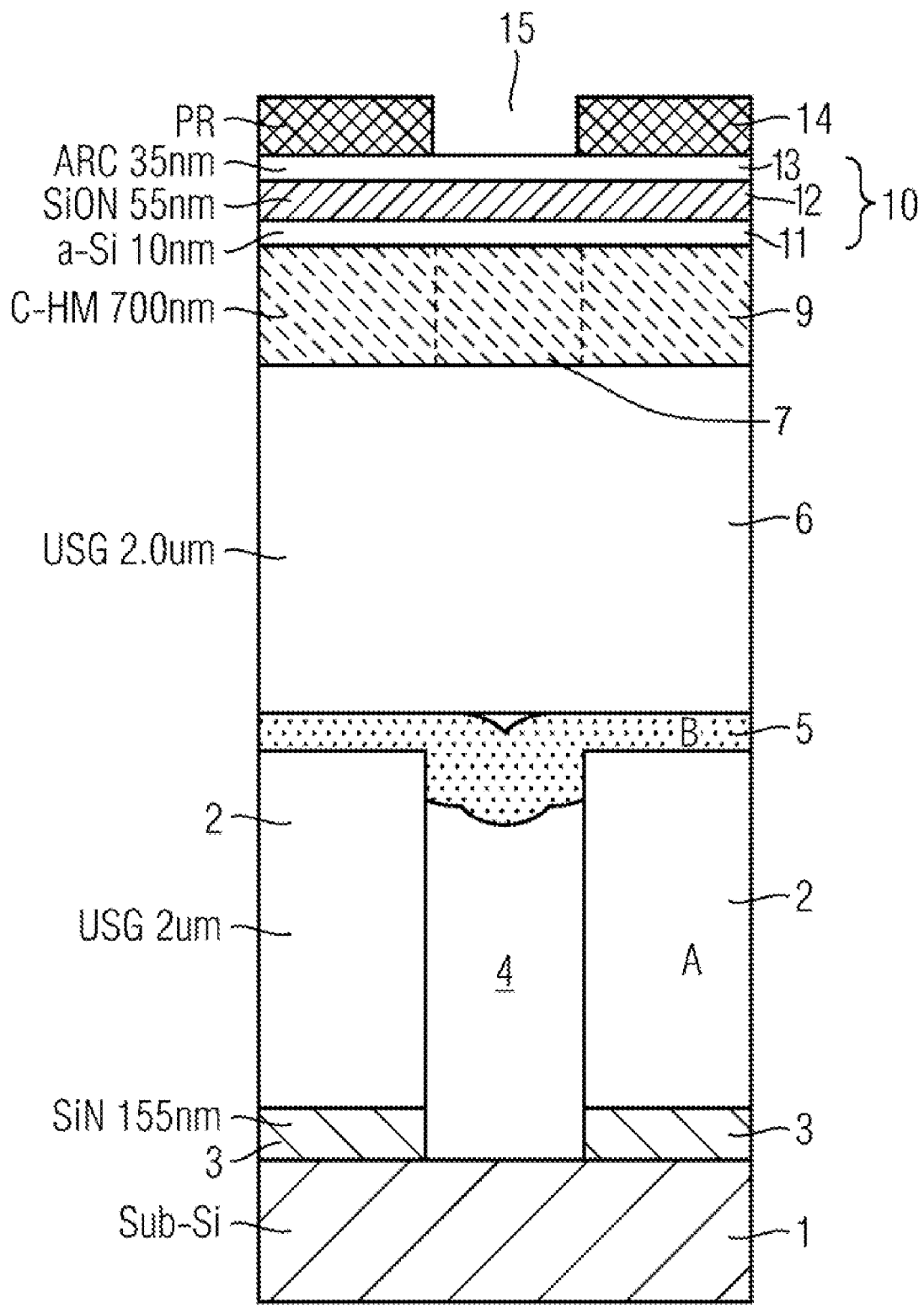

As shown in FIG. 3, a second layer 6 is deposited on the cover layer 5. The second layer 6 may be made of the same material as the first layer 2. Depending on the embodiment, the second layer 6 may also consist of materials different than materials of the first layer, whereby the used material of the second layer 6 may be processed to form a second opening 8 (see FIG. 4) in the second layer 6. Depending on the embodiment, a hard mask 9 is deposited on the second layer 6. The hard mask 9 may for example be made of carbon.

Depending on the embodiment, another mask layer, or fourth layer 10 is deposited on the hard mask layer 9. The fourth layer 10 may include a first sub-layer made of amorphous silicon 11, a second sub-layer 12 made of silicon oxynitride and a third sub-layer 13 serving as an anti-reflection layer. On the fourth layer 10, a photo resist layer 14 is deposited and structured as illustrated in FIG. 3. In the photo resist layer 14, an opening 15 is formed above the first opening 4.

Figure 4:
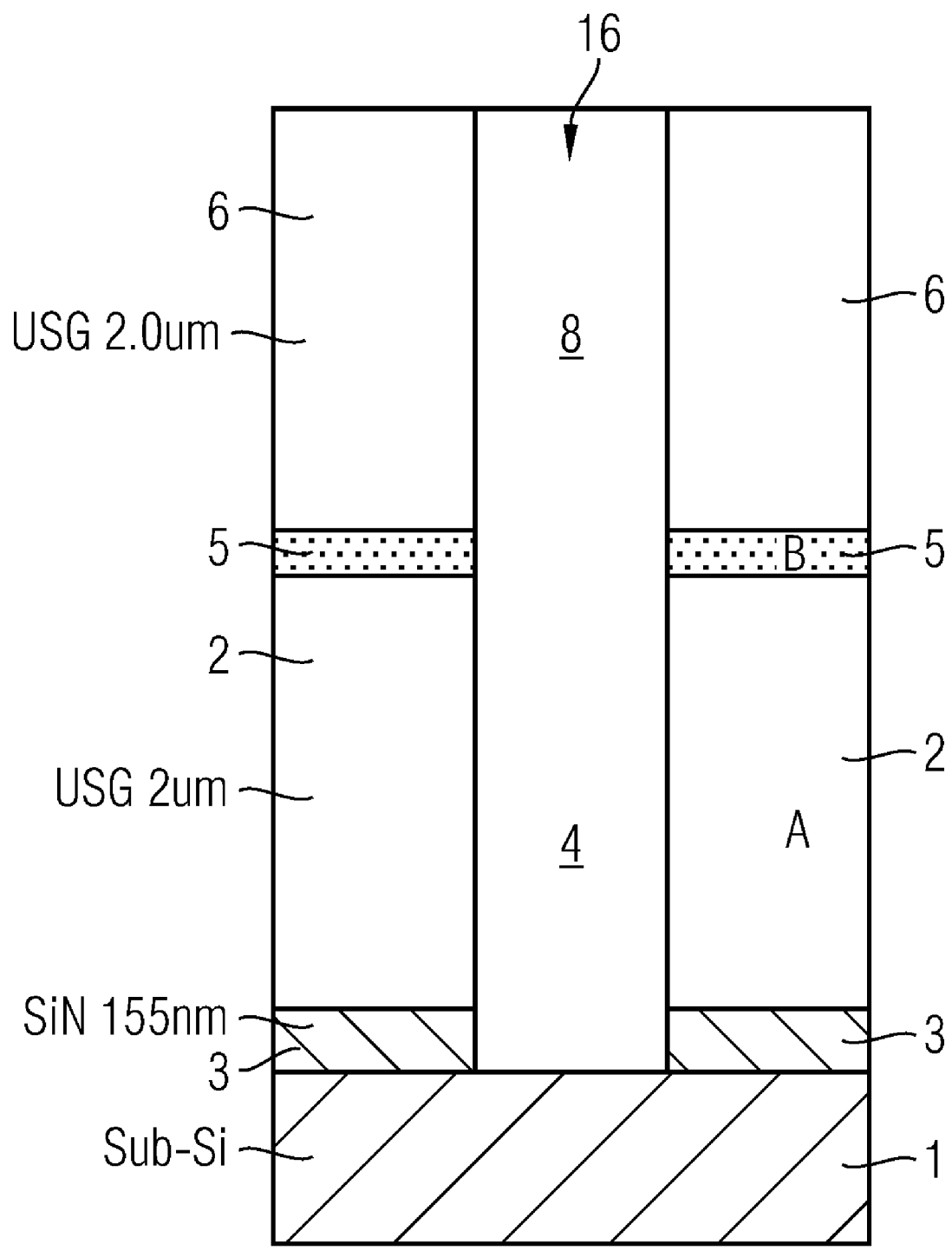

In certain embodiments, the hard mask 9 is structured with an opening 7 that is arranged above the first opening 4. A second opening 8 is formed in the second layer 6 via the opening 7. The second opening 8 may be formed by an etching process. In one embodiment the second opening 8 is formed by a dry etching process. Using a highly anisotropic etch with a high etching selectivity between the second layer 6 and the hard mask layer 9 in general allows achieving openings of high aspect ratio—openings of large depth with a small diameter. The second opening 8 may represent a hole, a trench, an aperture or a recess. A hole is formed in the cover layer 5 via the second opening 8 above the first opening 4. Furthermore, the hard mask 9, the fourth layer 10 and the photo resist layer 14 are removed. This results in an opening 16 including the connected first and the second openings 4, 8. The further opening 16 is illustrated in FIG. 4. The further opening 16 may represent a hole, a trench, an aperture or a recess, for example.

The described process allows for forming a further opening 16 with a high aspect ratio without filling up the first opening 4 with sacrificial material before depositing the second layer 6 and forming a second opening 8 in the second layer 6.

Figure 5:
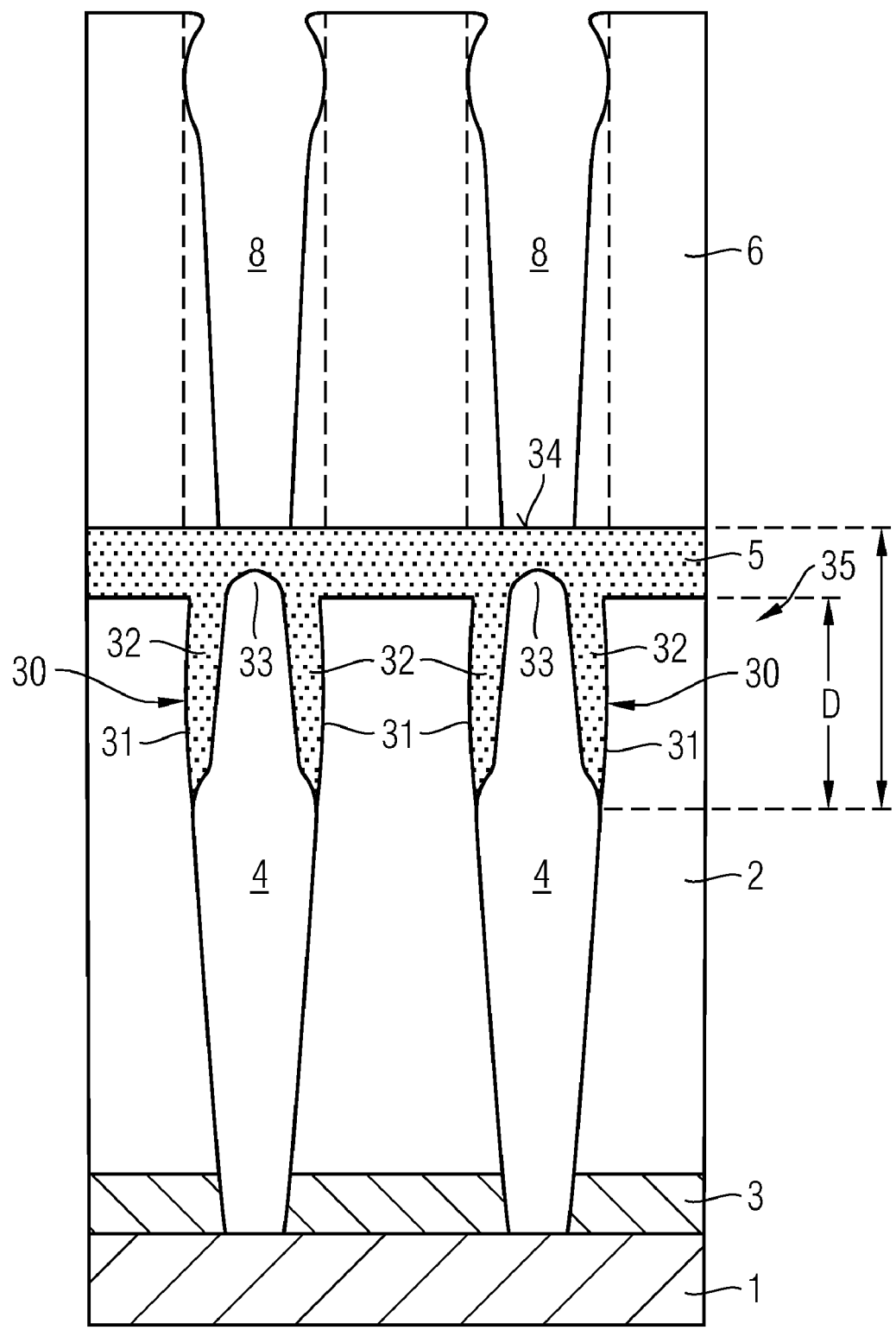
FIGS. 5-7 illustrate portions of an exemplary integrated circuit device in accordance with another embodiment of the present invention.

FIG. 5 illustrates another embodiment having a substrate 1, on which a third layer 3 is arranged. On the third layer 3 a first layer 2 is arranged. In the first layer 2 and in the third layer 3 first openings 4 are disposed. The first openings 4 are covered by a cover layer 5. On the cover layer 5 a second layer 6 is deposited. In the second layer 6 second openings 8 are arranged, whereby the second openings 8 are disposed above the first openings 4. The second openings 8 are separated from the first openings 4 by the cover layer 5. The first openings 4 and the second openings 8 may be formed by an anisotropic etching process. However, the anisotropic etching process is not absolutely anisotropic—the first and the second openings 4, 8 may have a conical shape having a greater cross-sectional face of the upper region compared to a lower region. This leads to an out-bulging in an upper section 30 of the first and the second openings 4, 8.

The upper section 30 of the first opening 4 may include at a side wall 31 of the first opening 4 a partial layer 32 of the cover layer 5 that extends from the upper end face of the first layer 2 till a depth D down in the first opening 4. The partial layer 32 is part of the cover layer 5 and made of the same material as the cover layer 5. The partial layer 32 may have the shape of a sleeve that extends from the cover layer 5 in the first opening 4. Because of the partial layer 32, the out-bulging shape of the upper section 30 of the first opening 4 is narrowed to a smaller cross-sectional area 33 at the end of the upper section 30.

Depending on the particular embodiment, the cross-sectional area 33 at the upper end of the upper section 30 may have a similar, the same or a smaller cross-sectional area than a second cross-sectional area 34 at the bottom of the second opening 8. A function of the partial layer 32 is to narrow the cross-sectional area 33 of the upper section 30 of the first opening 4 in a range that may be at least as small, or smaller, as the second cross-sectional area 34 of the second opening 8. The advantage of this embodiment is that if the first opening 4 and the second opening 8 are connected by removing the cover layer 5 at the bottom of the second opening 8 and via the second opening 8 a smooth transition section 35 is attained with small or no flanges.

Figure 6:
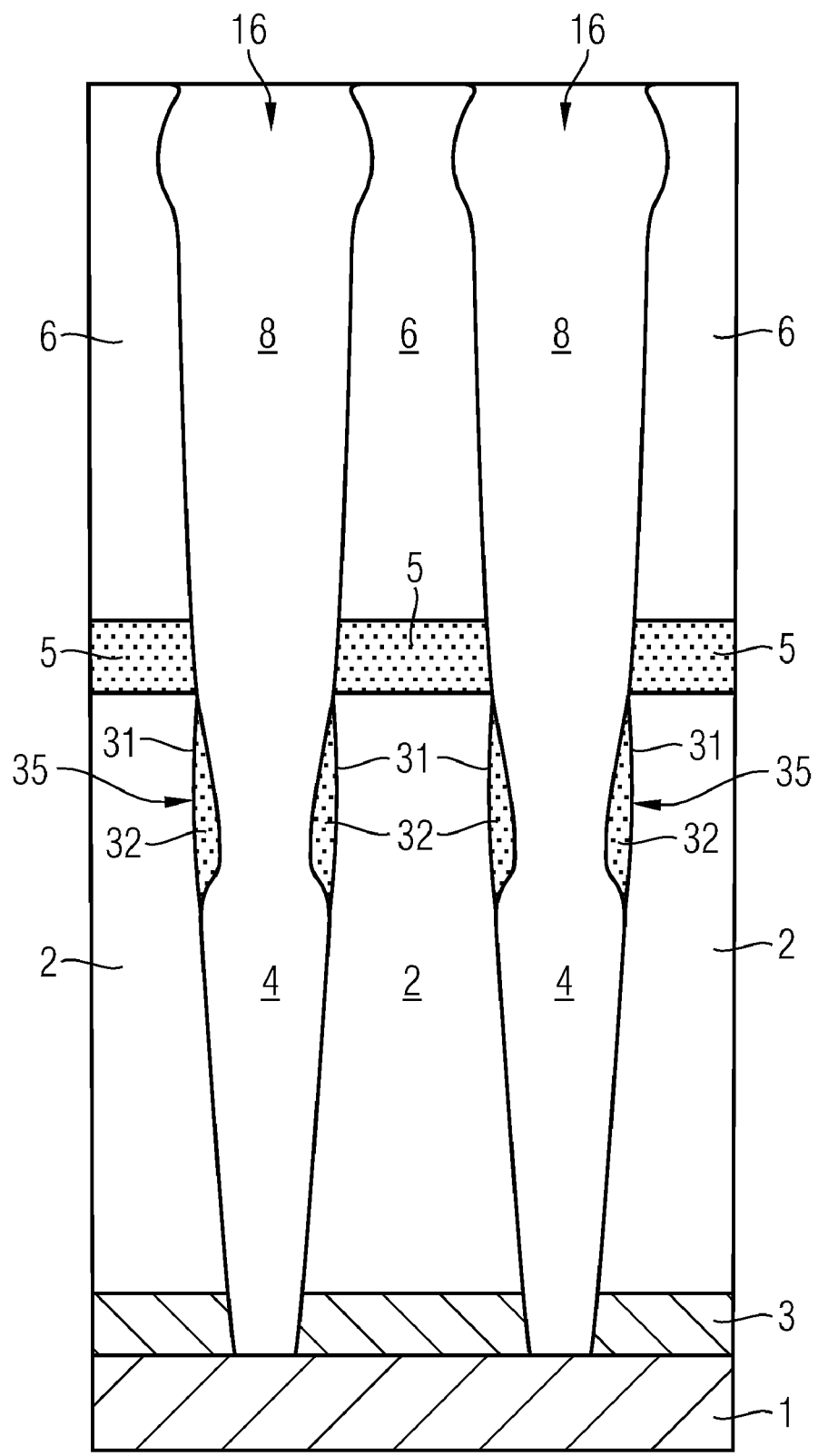

As illustrated in FIG. 5, the cover layer 5 may be used as a stopping layer for the etching process that is used for forming the second opening 8. After etching the second openings 8 as illustrated in FIG. 5, the cover layer 5 may be at least partially removed on the bottom of the second opening 8 via the second openings 8, thus resulting in connecting a second and a first opening 8, 4 (FIG. 6). The first and the second layer 2, 6 may for example be made of silicon oxide.

Depending on the embodiment, the second openings 8 may be formed with a larger or smaller cross sectional area at the bottom than the upper section 30 of the first openings 4. The additional widening of the second openings 8 as illustrated with doted lines in FIG. 5 may be processed by an optional wet etching process. For the wet etching process, a hydrogen fluoride based etching liquid may be used. Furthermore, a doping gradient in an upper section of the second layer 6 may be used to reduce the widening of the first and/or the second opening 4, 8 during the etching of the second opening 8. A higher doping concentration increases the etching rate compared to a lower doping concentration.

FIG. 6 illustrates the device after the opening of the cover layer 5 and the optional wet widening process as discussed above with a second opening 8 having a smaller cross sectional area at the bottom than the cross sectional area of the upper section 30 of the first opening 4. The cover layer 5 may be opened, or removed, from the bottom of the second opening 8 by an anisotropic etching process via the second opening 8. Remaining material of the partial layer 32 of the cover layer 5 disposed at an upper end section of the first openings 4 may be etched off or removed by an over-etching process or by an appropriate wet etch chemistry. The result is a further opening 16 including a first opening 4 and a second opening 8 with a smooth transition section 35 that is arranged in an upper section 30 of the first opening 4.

The transition section 35 that starts at the upper side of the cover layer 5 and that ends at the lower end of the partial layer 32 has a smooth side wall 31, because the out-bulged shape of the upper section 30 of the first opening 4 is compensated by the partial layer 32 that covers the side wall 31 of the upper section 30. By providing the partial layer 32 in the upper section 30 of the first opening 4, a smooth transition section 35 is provided between the first and the second opening 4, 8.

Figure 7:
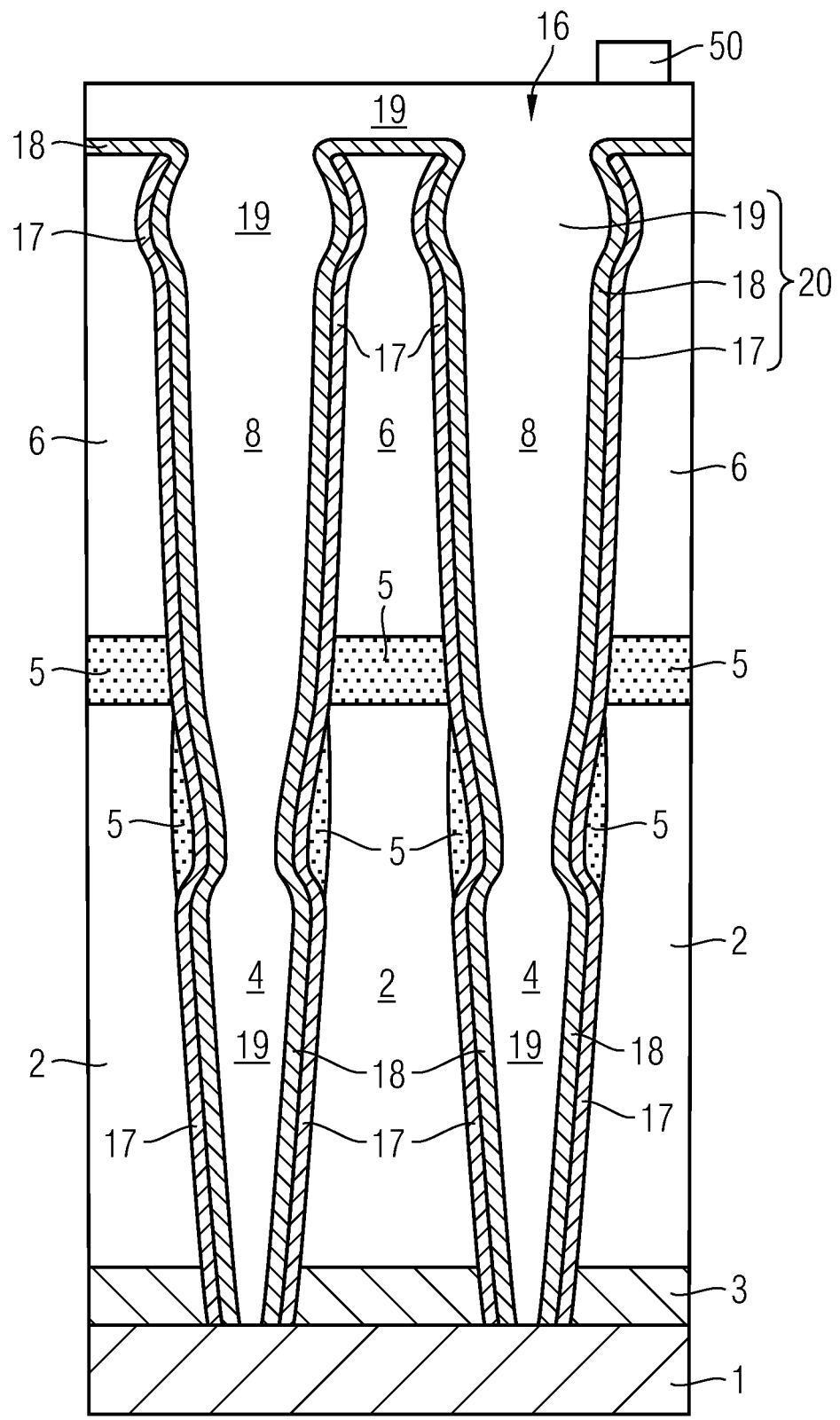

As illustrated in FIG. 7, a first electrode layer 17 is deposited in the recesses 16. A dielectric layer 18 is deposited on the first electrode layer 17, and a second electrode layer 19 is deposited on the dielectric layer 18. The first electrode layer 17 is electrically insulated from the second electrode layer 19 by the dielectric layer 18. As a result, a capacitor 20 is formed in the further openings 16 including the first electrode layer 17, the dielectric layer 18 and the second electrode layer 19. The first and second electrode layers 17, 19 may, for example, include metal such as tungsten or titanium nitride. The dielectric layer 18 may comprise a high k-dielectric material. Of course, opening formed with the method disclosed herein may also be used to create other parts of an integrated circuit device, such contacts, vias, free standing structures, etc. Accordingly, the scope of the invention is not limited to memory devices or capacitors, for instance.

The capacitor 20 may be used for any electrical circuit or integrated circuit that includes a capacitor element. The capacitor 20 may for example be used as a capacitor of a memory cell of a memory circuit. The memory circuit may be implemented as a dynamic random access memory or any other kind of memory circuit, for example. The capacitor 20 may be electrically connected with an electric circuit, for example an integrated circuit 50. The second electrode 19 may be connected with the integrated circuit 50. The electric circuit may be constituted as a memory circuit or a processor circuit or any other digital circuit. The capacitor may be part of a memory cell for storing data in the capacitor.

Figure 8:
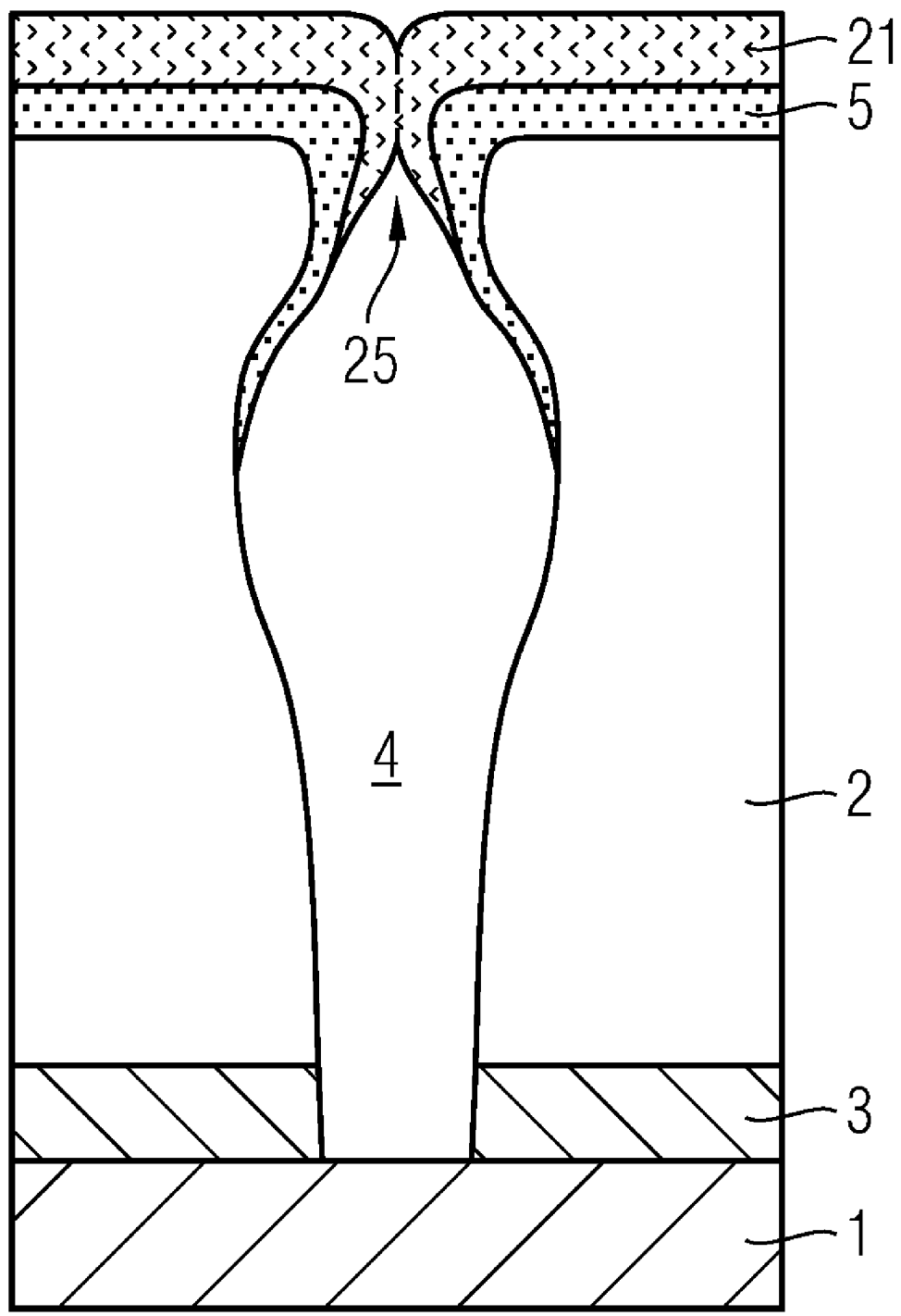
FIGS. 8-10 illustrate portions of an exemplary integrated circuit device in accordance with a further embodiment of the present invention, including an opening with a double layer as non-conformal cover layer.

FIG. 8 illustrates a further embodiment, wherein a first cover layer 5 and a second cover layer 21 are used for closing the first opening 4. The first cover layer 5 may be deposited in a non-conformal process narrowing the opening face to a narrow aperture 25 of the first opening 4. A second cover layer 21 is deposited that closes the aperture 25 of the first cover layer 5. The first opening 4 is thus closed using a double layer structure including a first and a second cover layer 5, 21.

Figure 9:
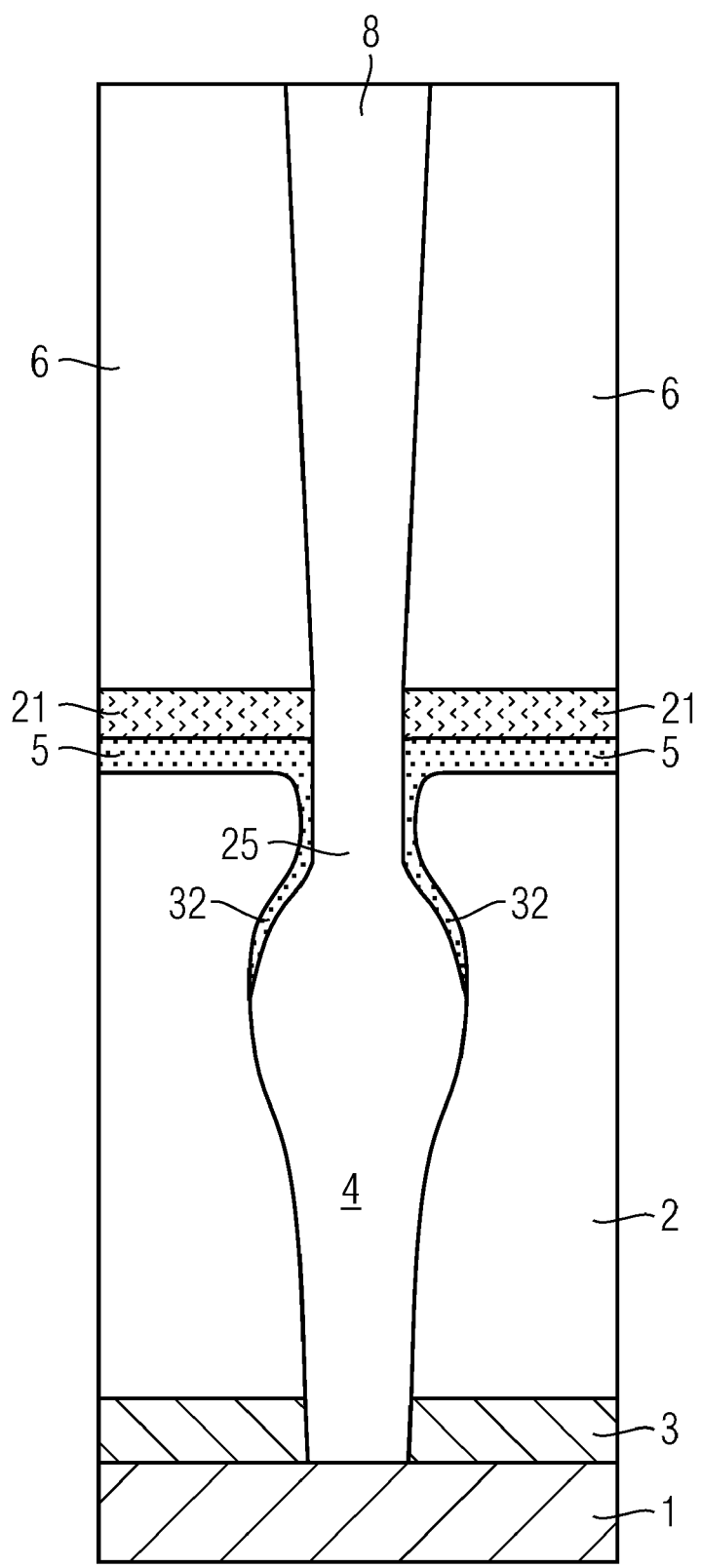

The cover structure with the first and the second cover layer 5, 21 provides the function of covering the first opening 4 before depositing the second layer 6 and forming the second opening 8 and a second layer 6. The first and the second cover layers 5, 21 are opened at the bottom of the second opening 8 via the second opening 8 as it is shown for the cover layer 5 of the embodiment illustrated in FIG. 6. This process is illustrated in FIG. 9. A capacitor element 20 may be introduced in the first and the second opening 4, 8, for example, as shown in the embodiment illustrated in FIG. 10.

Figure 11:
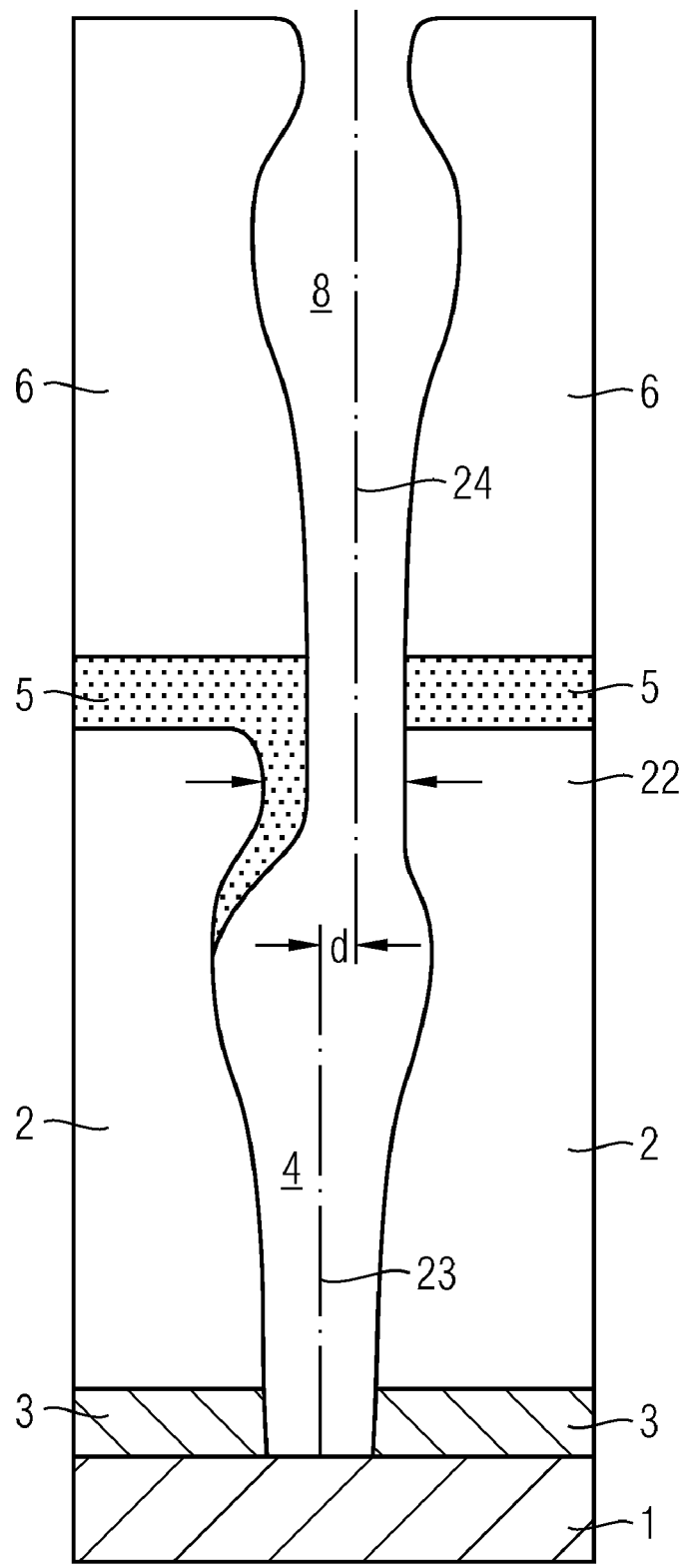
FIG. 11 illustrates a schematic cross sectional view of portions of an exemplary integrated circuit device in accordance with a still further embodiment of the present invention, including an opening with a misaligned first and second recess, the double recess with a narrowed connection hole.

FIG. 11 illustrates a schematic view of another embodiment having a substrate 1, a third layer 3, a first layer 2, a cover layer 5 and second layer 6. In the first layer 2 and in the third layer 3 a first opening 4 is disposed. In the second layer 6 a second opening 8 is disposed, whereby an axis 24 of the second opening 8 is not in the same line as an axis 23 of the first opening 4. Thus, the second opening 8 is arranged aside a small distance d relative to the first opening 4. This displacement of the axes 23,24 may be a result of a misalignment of the formation process of the second recess 8 relative to the first recess 4. This results in a narrow connecting section 22 that connects the first opening 4 and the second opening 8. Depending on the particular embodiment, the narrow connecting section 22 may be widened by an isotropic etching process, for example by a wet etching process.

Figure 10:
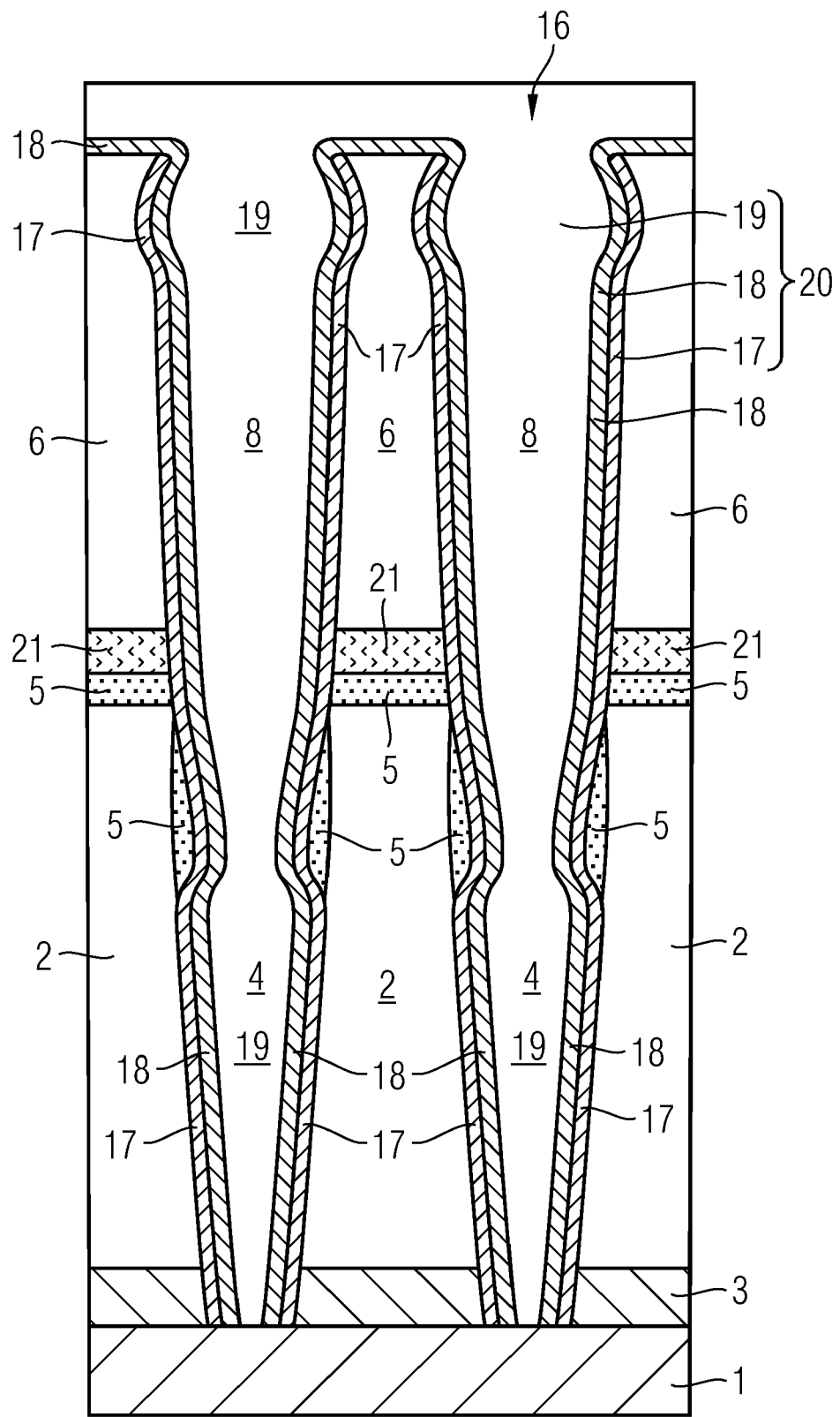

A misalignment as illustrated in FIG. 11 resulting from the cover layer 5 that extends with a partial layer 32 to a predetermined depth D in the first opening 4 may be compensated for by providing a smooth side wall in the upper section 30 between the first opening 4 and the second opening 8. Therefore, it is possible to extend an overlay of process windows for introducing the first opening 4 and introducing the second opening 8. The same is possible with a cover structure including a first and a second cover layer 5, 21 as illustrated in FIGS. 8-10.

Rough flanges in the transition section 35 may be disadvantageous, in particular if a first electrode layer 17 is deposited on the side walls of the first opening 4, the second opening 8 and the transition section 35.

Figure 12:
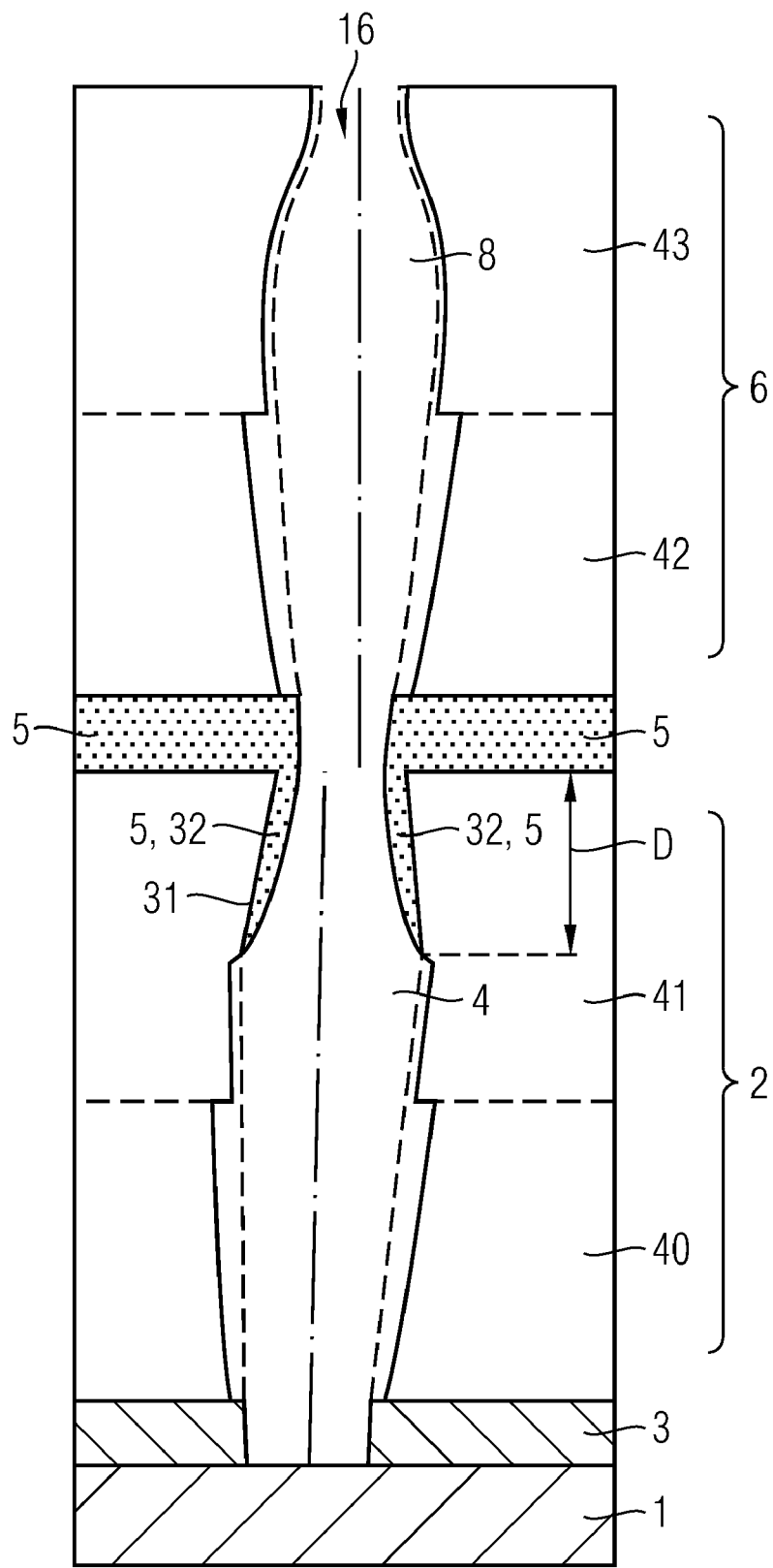
FIG. 12 illustrates portions of an exemplary integrated circuit device in accordance with another embodiment of the present invention, including sub layers.

FIG. 12 illustrates a further embodiment with a substrate 1, on which a third layer 3 is deposited. On the third layer 3 a first layer 2 is arranged that includes a first sub layer 40 disposed on the third layer 3 and a second sub layer 41 disposed on the first sub layer 40. The first sub layer 40 may be at least partially made of silicon oxide. The second sub layer 41 may also be at least partially made of silicon oxide, whereby the first and the second sub layer 40, 41 differ in a wet etch rate. The etch rate may differ because of a different concentration of dopants, for example boron or phosphor. Furthermore, the wet etching rate may also differ because of a different concentration of nitrogen, carbon or hydrogen of the two silicon oxide layers. In other embodiments other materials may be used for providing the sub layers with different wet etching rates.

The first sub layer 40 has a larger wet etching rate than the second sub layer 41. The first opening 4 is formed in the first and the second sub layers 40, 41 by a dry etching process, whereby the cross sectional area of the first opening 4 at an upper end of the first sub layer 40 is larger than the cross sectional area of the first opening 4 at an upper end of the second layer 41. The first opening 4 is also introduced in the third layer 3 by a dry etching process. An etching mask is removed that is used for positioning the first opening 4. The cover layer 5 is deposited on the second sub layer 41, whereby the first opening 4 is covered with the cover layer 5. Additionally, the cover layer 5 is introduced down to a given depth D in the first opening 4 of the second sub layer 41 as illustrated in FIG. 5.

The second layer 6 is deposited, whereby the second layer 6 includes a third sub layer 42 and fourth sub layer 43. The third and the fourth sub layers 42, 43 differ in a wet etching rate, whereby the third sub layer 42 that is deposited on the cover layer 5 has a greater wet etching rate than the fourth sub layer 43 that is deposited on the third sub layer 42. The wet etching rates may differ because of a different concentration of dopants, for example boron or phosphor. Furthermore, the wet etching rate may differ because of a different concentration of nitrogen, carbon or hydrogen in the third and the fourth sub layers 42, 43. In one embodiment, the third and the fourth sub layers 42, 43 may be made of silicon oxide.

In certain embodiments, the second opening 8 is introduced in the third and the fourth sub layers 42, 43 by a dry etching process.

The cover layer 5 is opened by an etching process at the bottom of the second opening 8 via the second opening 8. This leads to the embodiment illustrated in FIG. 12. The arrangement of FIG. 12 illustrates a further opening 16 having a connected first opening 4 and second opening 8.

The cross sectional area of the second opening 8 is larger in the fourth sub layer 43 than in the third sub layer 42 as illustrated with a dashed line in FIG. 12. To reduce the differences a wet etching process is performed. Because of the different wet etch rates the second opening 8 is more widened in an upper section of the third sub layer 32 than in a section of the fourth sub layer 43 by a following wet etching process. Therefore the cross sectional area of the second opening 8 is at least partially balanced.

In one embodiment, the first and/or second opening 4, 8 are bulged by a wet etching process after forming the first opening 4 and/or the first and second openings 4, 8 as explained above. The bulging processes are used to bulge out one or both of the lower sub layers 40, 42 so they are as wide as, or wider, than the corresponding upper sub layer 41, 43.

The third opening 16 as illustrated in FIG. 12 may be used for forming a capacitor 20 as it is illustrated in FIG. 10.

Depending on the particular embodiment, the first layer 2 may include more than two sub layers that differ in a wet etching rate, whereby the lower of the sub layers has a greater wet etching rate than the upper of the sub layers. Thus it is possible to reduce the bulging out of the upper sub layer by forming at a first step the first and/or the second opening 4, 8 in the first and/or the second sub layer 2, 6 by a dry etching process. In a following wet etching process the first and/or second recesses are more widened in the lower sub layer than in the upper sub layer. Thus it might be possible to reduce the tapered shape of the first and/or the second recess 4, 8 caused by the dry etching process after which an upper section of the first and second recess has a larger cross sectional area than a lower section of the first and the second recess. In a further embodiment, the cross sectional area of the first and/or the second recess may be widened by the wet etching process more than 5 nm in the lower sub layer compared to the upper sub layer. In a further embodiment, the cross sectional area of the first and/or the second recess may be widened more than 10 nm or more than 15 nm in the sub layer compared to the upper sub layer of the first and/or second layer 2, 6.

A first dry etching process is used for etching the first opening 4 and the first layer 2 and/or the second opening 8 and the second layer 6 may be performed at a temperature between 10° C. and 60° C., with a pressure between 10 and 50 mTorr, with a power between 1500 and 3000 Watt for the high frequency source and a further power between 1500 and 4000 Watt for the low frequency source with a gas mixture of oxygen, fluorocarbon and argon (O2/Cx/Fy/Hz/Ar). This first etching process stops at the cover layer (5), if for example the cover layer 5 is made of silicon nitride. For opening the cover layer 5 at the bottom of the second opening 8, a second dry etching process may be used. For example, the second dry etching process is processed at a temperature between 10° C. and 60° C. with a pressure between 10 and 40 mTorr, a first power between 800 and 2000 W and a second power between 100 and 800 W with a gas mixture of oxygen and carbon hydrogen and flour (O2/CHx/Fy), whereby the first power is the power for the low frequency source and the second power is the power for the high frequency source of the plasma etching device.

The dry etching process may be performed with the dual frequency capacitive coupled plasma etching tool.

The dry etching of the first and/or the second opening 4,8 in a silicon oxide first and/or second layer 2,6 may be performed by the following processes:

Process 1: first oxide etch:

Ox1: time: 1:00 min/pressure: 45 mTorr/high frequency power: 2700 Whf/low frequency power: 3600 Wlf/gas flows: 46 sccm O2/40 sccm C4F6/1200 sccm Ar/24 sccm C3F8/12 sccm CH2F2;/center flow ratio (CFR) 60/helium backside pressure (HeBS) 45/20;

Process 2: second oxide etch:

Ox2: time: 2:00 min/pressure: 45 mTorr/high frequency power: 2700 W/low frequency power: 3600 W/; gas flows 50 sccm O2/44 sccm C4F6/1200 sccm Ar/22 sccm C3F8/10 sccm CH2F2/; CFR 60/HeBS 45/20

Process 3: third oxide etch:

Ox3: time: 2:30 min/pressure: 30 mTorr/high frequency power: 2700 W/low frequency power: 3600 W; gas flows 53 sccm O2/46 sccm C4F6/1000 sccm Ar/20 sccm C3F8; center flow ratio (CFR) 60/helium backside pressure HeBS 45/20

Each of the etch processes is used for forming the first and/or the second opening 4,8 in the oxide of the first and/or second layer 2, 6 till a depth of 600-1000 nm.

An oxygen flash process may be performed with the following parameters:

O2FL: time: 0:15 min/pressure: 45 mTorr/high frequency power: 1500 Whf/low frequency power: 500 Wlf, gas flows: 80 sccm O2/500 sccm Ar/center flow ratio (CFR) 60/helium backside pressure HeBS 45/20 (in situ polymer strip)

The silicon nitride cover layer 5 may be removed from the bottom of the second opening 8 with the following process:

Time: 2:00 min/pressure: 20 mTorr/high frequency power: 1500 W/low frequency power: 500 Wlf/gas flows: 20 sccm O2/30 sccm CH3F/200 sccm CO/center flow ratio (CFR) 70/HeBS 45/20.

The first and/or the second opening 4, 8 are formed in a silicon oxide first and/or second layer in a further embodiment with the following process parameters:

Temperature: 10° C.-60° C.; time: 3-10 min/pressure: 10-50 mTorr/high frequency power: 1500-3000 Whf/low frequency power: 1500-4000 Wlf/gas flows: 10-70 sccm O2/10-70 sccm C4F6/600-1500 sccm Ar/0-35 sccm C3F8/0-35 sccm CH2F2.

In a further Oxygen flash process:

O2FL: time: 0:10-0:30 min/pressure: 45 mTorr/high frequency power: 500-1500 Whf/low frequency power: 0-500 Wlf/gas flows: 20-400 sccm O2/0-800 sccm Ar (insitu polymer strip).

In a further embodiment, the cover layer 5 made of silicon nitride may be etched using the following parameters:

Temperature: 10-60° C.; time: 1-3 min/pressure: 10-40 mTorr/high frequency power 800-2000 W/low frequency power: 100-800 W/; gas flows: 10-60 sccm O2/10-60 sccm CH3F/0-400 sccm CO.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming an integrated circuit device, comprising:
   forming a first opening in a first layer;
   depositing a cover layer contacting the first layer such that an upper portion of the first opening is closed by the cover layer to form a void in a lower portion of the first opening, the cover layer consisting of a single material layer;
   depositing a second layer on the cover layer;
   forming a second opening through the second layer; and
   forming a hole through the cover layer via the second opening to connect the first and second openings such that sidewalls of the cover layer connect the first and second openings.

2. The method of claim 1, further comprising depositing the first layer on a substrate.

3. The method of claim 1, further comprising providing a third layer between the first layer and a substrate.

4. The method of claim 3, wherein forming the first opening in the first layer further includes forming the first opening through the third layer.

5. The method of claim 1, wherein forming the first opening includes an etching process.

6. The method of claim 5, wherein the etching process is a dry etching process.

7. The method of claim 1, wherein depositing the cover layer includes a non-conformal depositing process.

8. The method of claim 1, wherein depositing the cover layer includes filling an upper section of the first opening to a predetermined depth.

9. The method of claim 1, wherein depositing the cover layer includes covering a sidewall of the first opening to a predetermined depth.

10. The method of claim 1, wherein forming the second opening includes an etching process.

11. The method of claim 10, wherein the cover layer is used as a stopping layer for the etching process.

12. The method of claim 1, further comprising depositing a mask layer on the second layer.

13. The method of claim 12, further comprising depositing a fourth layer on the mask layer.

14. The method of claim 13, wherein depositing the fourth layer includes depositing at least one of a first sub-layer, a second sub-layer and a third sub-layer.

15. The method of claim 14, wherein the third sub-layer serves as an anti-reflection layer.

16. The method of claim 13, further comprising depositing a photo resist layer on the fourth layer.

17. The method of claim 16, further comprising forming an opening in the photo resist layer.

18. The method of claim 17, further comprising removing the mask layer, the fourth layer and the photo resist layer.

19. The method of claim 1, further comprising widening the second opening.

20. The method of claim 19, wherein widening the second opening includes a wet etching process.

21. The method of claim 1, wherein forming the hole through the cover layer via the second opening includes an anisotropic etching process.

22. The method of claim 1, wherein the integrated circuit device includes a capacitor, the method further comprising:
depositing a first electrode layer in the connected first and second openings;
depositing a dielectric layer on the first electrode layer; and
depositing a second electrode layer on the dielectric layer, such that the second electrode layer is electrically insulated from the first electrode layer by the dielectric layer.

23. The method of claim 2, wherein depositing the first layer includes depositing first and second sub layers.

24. The method of claim 2, wherein depositing the second layer includes depositing third and fourth sub layers.

25. A method for forming an integrated circuit device, comprising:
forming a first opening in a first layer;
depositing a cover layer on the first layer such that an upper portion of the first opening is closed by the cover layer to form a void in a lower portion of the first opening;
depositing a second layer on the cover layer;
forming a second opening through the second layer, the second opening aligned with the first opening; and
forming a hole through the cover layer via the second opening to connect the first and second openings such that sidewalls of the cover layer are aligned with sidewalls of the second opening and sidewalls of the cover layer directly contact sidewalls of the first opening or are aligned with and directly connect to sidewalls of the first opening.

26. The method of claim 25, wherein forming the first opening comprises forming the first opening including a lower portion having a first cross-sectional area and an upper portion having a second cross-sectional area greater than the first cross-sectional area.

27. The method of claim 25, wherein forming the second opening comprises forming the second opening including a lower portion having a first cross-sectional area and an upper portion having a second cross-sectional area greater than the first cross-sectional area.

28. The method of claim 25, wherein forming the first opening comprises forming the first opening having vertical sidewalls; and
wherein forming the second opening comprises forming the second opening having vertical sidewalls.

29. The method of claim 25, wherein forming the hole through the cover layer comprises forming the hole through the cover layer such that portions of the cover layer remain on sidewalls of the first opening.

30. The method of claim 25, wherein the first layer comprises a first sub layer and a second sub layer disposed on the first sub layer, the second sub layer having a different etching rate than the first sub layer.

31. The method of claim 30, wherein the first sub layer has a greater etching rate than the second sub layer.

32. The method of claim 25, wherein the second layer comprises a first sub layer and a second sub layer disposed on the first sub layer, the second sub layer having a different etching rate than the first sub layer.

33. The method of claim 32, wherein the first sub layer has a greater etching rate than the second sub layer.

34. The method of claim 25, wherein forming the hole through the cover layer comprises forming the hole through the cover layer such that sidewalls of the cover layer are aligned with sidewalls of the first opening.

35. A method for forming an integrated circuit device, comprising:
forming a first opening in a first layer;
depositing a cover layer on the first layer such that an upper portion of the first opening is closed by the cover layer to form a void in a lower portion of the first opening;
depositing a second layer on the cover layer;
forming a second opening through the second layer, the second opening aligned with the first opening;
forming a hole through the cover layer via the second opening to connect the first and second openings such that sidewalls of the cover layer are aligned with sidewalls of the second opening;
depositing a first electrode layer over sidewalls of the cover layer and sidewalls of the first and second openings;
depositing a dielectric layer on the first electrode layer; and
depositing a second electrode layer on the dielectric layer such that the second electrode layer is electrically insulated from the first electrode layer by the dielectric layer.

36. The method of claim 35, wherein forming the first opening comprises forming the first opening including a lower portion having a first cross-sectional area and an upper portion having a second cross-sectional area greater than the first cross-sectional area.

37. The method of claim 35, wherein forming the second opening comprises forming the second opening including a lower portion having a first cross-sectional area and an upper portion having a second cross-sectional area greater than the first cross-sectional area.

38. The method of claim 35, wherein forming the first opening comprises forming the first opening having vertical sidewalls; and
wherein forming the second opening comprises forming the second opening having vertical sidewalls.

39. The method of claim 35, wherein forming the hole through the cover layer comprises forming the hole through the cover layer such that portions of the cover layer remain on sidewalls of the first opening.

40. The method of claim 35, wherein the first layer comprises a first sub layer and a second sub layer disposed on the first sub layer, the second sub layer having a different etching rate than the first sub layer.

41. The method of claim 40, wherein the first sub layer has a greater etching rate than the second sub layer.

42. The method of claim 35, wherein the second layer comprises a first sub layer and a second sub layer disposed on the first sub layer, the second sub layer having a different etching rate than the first sub layer.

43. The method of claim 42, wherein the first sub layer has a greater etching rate than the second sub layer.

44. The method of claim 35, wherein forming the hole through the cover layer comprises forming the hole through the cover layer such that sidewalls of the cover layer are aligned with sidewalls of the first opening.

45. The method of claim 25, wherein depositing the cover layer includes depositing first and second cover layers.

* * * * *